(12) United States Patent
Foster et al.

(10) Patent No.: US 6,307,913 B1
(45) Date of Patent: Oct. 23, 2001

(54) SHAPED SOURCE OF SOFT X-RAY, EXTREME ULTRAVIOLET AND ULTRAVIOLET RADIATION

(75) Inventors: Richard M. Foster, Manhattan Beach; Edmond Turcu, Del Mar, both of CA (US); Jose M. Sasian, Tucson, AZ (US); Harry Rieger, San Diego; James H. Morris, Encinitas, both of CA (US)

(73) Assignee: Jmar Research, Inc., San Diego, CA (US)

( * ) Notice: Subject to any disclaimer, the term of this patent is extended or adjusted under 35 U.S.C. 154(b) by 0 days.

(21) Appl. No.: 09/429,738

(22) Filed: Oct. 27, 1999

Related U.S. Application Data

(60) Provisional application No. 60/105,861, filed on Oct. 27, 1998.

(51) Int. Cl.$^7$ .................................................. G21K 5/00
(52) U.S. Cl. .................................................. 378/34; 378/119
(58) Field of Search ........................ 378/34, 119

(56) References Cited

U.S. PATENT DOCUMENTS

| | | | |
|---|---|---|---|
| 4,504,964 | * 3/1985 | Cartz et al. | 378/119 |
| 4,635,282 | 1/1987 | Okada et al. | 378/34 |
| 4,771,447 | 9/1988 | Saitoh et al. | 378/119 |
| 4,866,517 | 9/1989 | Mochizuki et al. | 378/119 |
| 5,003,543 | * 3/1991 | Morsell et al. | 372/5 |
| 5,089,711 | 2/1992 | Morsell et al. | 250/492.3 |
| 5,102,776 | * 4/1992 | Hammer et al. | 430/311 |
| 5,223,957 | * 6/1993 | Itoh et al. | 359/17 |
| 5,339,346 | * 8/1994 | White | 378/34 |
| 5,426,686 | * 6/1995 | Rentzepis et al. | 378/34 |
| 5,459,771 | * 10/1995 | Richardson et al. | 378/119 |
| 5,577,091 | 11/1996 | Richardson et al. | 378/119 |
| 5,737,137 | 4/1998 | Cohen et al. | 359/859 |
| 5,790,574 | * 8/1998 | Rieger et al. | 372/25 |

OTHER PUBLICATIONS

Eugene Hecht and Alfred Zajac. Optics (Reading, MA: Addison–Wesley, 1979), pp. 116–117.*
Ross, Boon, Corbett, et al., "Design and Performance of a New Line Focus Geometry for X-ray Laser Experiments," *Applied Optics*, vol. 25, No. 9, pp. 1584–1588 (May 1, 1987).*
Ceglio, Hawryluk, and Sommargren. "Frpmt–End Design Issues In Soft X–Ray Projection Lithography," *Applied Optics*, vol. 32, pp. 7052–7056 (Dec. 1, 1993).*
Turcu, Forber, Grygier, et al., "High Power X-Ray Point Source For Next Generation Lithography," Proceedings of SPIE Conference on "EUV, X–Ray, and Neutron Optics and Sources," v. 3767, pp. 21–32 (Jul. 1999).*
Eugene Hecht and Alfred Zajac. Optics (Reading, MA: 1979).

* cited by examiner

*Primary Examiner*—Robert H. Kim
*Assistant Examiner*—Allen Ho
(74) *Attorney, Agent, or Firm*—Baker & McKenzie

(57) ABSTRACT

A shaped plasma discharge system is provided in which a shaped radiation source emits radiation at a desired frequency and in a desired shape. In one embodiment, a laser source provides an output beam at a desired intensity level to shaping optics. The shaping optics alters the output beam into a desired shaped illumination field. In an alternate embodiment, plural laser sources provide plural output beams and the shaping optics can produce a compound illumination field. The illumination field strikes a target material forming a plasma of the desired shape that emits radiation with a desired spatial distribution, at a desired wavelength, preferably in the x-ray, soft x-ray, extreme ultraviolet or ultraviolet spectra. In another embodiment an electric discharge generates the required shaped radiation field. The shaped emitted radiation proceeds through an optical system to a photoresist coated wafer, imprinting a pattern on the wafer.

4 Claims, 11 Drawing Sheets

SHAPED SOURCE OF SOFT X-RAY, EXTREME ULTRAVIOLET AND ULTRAVIOLET RADIATION

Priority is claimed from Provisional Application Ser. No. 60/105,861, filed Oct. 27, 1998, entitled "Shaped Radiation Field Soft X-Ray, Extreme Ultraviolet and Ultraviolet Source" and which is referred to and incorporated herein in its entirety by this reference.

FIELD OF THE INVENTION

The present invention relates to a method and apparatus for providing a shaped radiation source or field in the ultraviolet, extreme ultraviolet, soft x-ray and other emission spectra, and to a method and apparatus for performing lithography using the emitted radiation, such as is useful in integrated circuit manufacturing.

BACKGROUND OF THE INVENTION

In photolithography, the wavelengths of radiation sources have progressed from the visible spectrum to the deep ultraviolet (approximately 365 nanometers to approximately 100 nanometers). The reduction in wavelength is dictated by the requirement for smaller circuit feature sizes and the particular wavelengths are determined by the availability of high power radiation sources.

For advanced photolithography, there is a need for short wavelength radiation sources to produce smaller and higher performance integrated circuits. Wavelengths of 157 or 126 nanometers in the deep ultraviolet spectrum and 13 or 10 nanometers in the soft x-ray spectrum (sometimes characterized as the extreme ultraviolet spectrum) are being considered for advanced photolithography systems. The presently known photolithography apparatus suffers deficiencies in producing high power radiation at such wavelengths at or below 157 nanometers in an efficient, reliable and economical fashion.

One example of a proposed soft x-ray or extreme ultraviolet projection lithography apparatus using an arc-shaped illumination field, called a "ring field" is described in Ceglio, Hawryluk and Sommargren, "Front-End Design Issues In Soft-X-Ray Projection Lithography," *Applied Optics*, vol. 32, pp. 7050–7056 (Dec. 1, 1993). Plasma emitting radiation in a desired wavelength is created by striking a target with an optical laser beam focused to a small spot. In one such system, it is proposed that the optical laser beam be scanned across the target in an arc or ring field pattern (i.e. creating a scanned point-type source). In another such system, an arc or ring field pattern is generated from a point-source of radiation by condenser optics, creating a narrow ring field. Ultimately a mask and wafer (typically coated with a photoresist) is illuminated with the arc or ring field pattern. Because the pattern does not illuminate the entire mask or wafer, the pattern is also scanned to illuminate the entire mask or wafer. One disadvantage is that scanning the laser beam to produce a ring field of extreme ultraviolet radiation increases the exposure time and generates inefficiencies and can result in a non-uniform field, which is not desirable in photolithography. Other disadvantages are that known ring field condenser optics are complex, difficult to properly align and expensive. Known condenser optics that use point-like radiation sources typically do not provide a sufficiently high amount of light and provide an undesirably high level of coherence for optimal mask illumination for photolithography applications.

There are also various techniques for shaping laser beams. For example, creating a line focus is known, as described in I. N. Ross et al., "Design and Performance of a New Line Focus Geometry For X-Ray Laser Experiments," *Applied Optics*, Vol. 25, No. 9, pp. 1584–87 (May 1, 1997).

Accordingly, there is a need for a system that provides a shaped illumination field, without resorting to scanning a series of points from a point source in creating arc shapes or relatively complex condenser optics in the creation of the shaped radiation field.

SUMMARY OF THE INVENTION

The present invention alleviates to a great extent the disadvantages of the known lithography systems and methods using shaped plasma discharges as sources of x-ray, soft x-ray, extreme ultraviolet and ultraviolet radiation. In one embodiment, a laser source (preferably such as used in a laser-plasma source system) provides an output beam (such as a laser-plasma source illumination) at a desired wavelength ($\lambda_1$), power level and beam quality in order to generate such a shaped plasma source. This laser source ultimately can impart in whole or part a shape to a plasma discharge from a target that emits radiation (at a wavelength $\lambda_2$) when illuminated by the illumination field of the laser source. Alternatively, a shaped plasma discharge is created by other apparatus, such as an electric discharge system, as described more fully below. The shaped plasma discharge preferably is directed to illuminate a mask/wafer combination as used in a photolithography system.

In the shaped laser source embodiment, the output beam (at a wavelength of $\lambda_1$) is shaped into a desired profile using shaping optics. Such a shaped laser beam can be formed into any beam profile, such as a line, arc or array of focused spots. In one embodiment, the shaping optics include a lens or a set of lenses that produce the desired shaped laser beam illumination field (which in a preferred embodiment produces a shaped plasma source for a shaped plasma radiation illumination field (at $\lambda_2$)). Alternatively, the shaping optics includes a compound or holographic lens, which produces the desired shaped illumination field. In another embodiment, the shaping optics includes one or more mirrors and optionally one or more lenses. Any combination of these optical components may be used. All or a portion of the shaping optics may be a part of the laser source, or they may be separate from the laser source.

In one embodiment, plural laser pulses are provided substantially at the same time, such as by using plural laser sources or splitting mirrors. The plural pulses are fed to plural shaping optics, which in turn generate plural shaped illumination fields. In this embodiment, for example, each pulse can be shaped into an arc, and the arcs can be combined in any desired fashion.

The shaped illumination field hits a plasma generating target downstream of the shaping optics. The ionized plasma emits radiation in the desired wavelength ($\lambda_2$). Any target may be used which generates the desired radiation emission. In one embodiment a solid material is used. For example, ice or solid xenon may be used to emit in the extreme ultraviolet spectrum (as used here, "UV" is an abbreviation for "ultraviolet" and "EUV" is an abbreviation for "extreme ultraviolet"; "EUV" and "soft x-ray" will be used synonymously). Examples of ice targets include a thin sheet or cylindrical block of ice. In use the target is illuminated by the shaped output laser beam ($\lambda_1$). The ice preferably is cooled by a heat pump, such as including liquid nitrogen reservoir placed in proximity to or in contact with the ice. In another embodiment, a metallic strip or band is provided as the target material. Alternatively, a liquid target may be provided, such as water or liquid xenon (or liquid forms of other gases) emitted from a nozzle in a stream. The liquid may be treated with additives such as zinc chloride, to adjust the emission spectrum. Likewise the solid component may be increased in this stream to the point where the stream comprises solid micropellets or clusters. For example, micropellets of tin or other suitable substances may be provided via a nozzle in a fluid (gas or liquid) stream.

In one embodiment, an electrical discharge is applied along with the shaped laser discharge. The shaped laser discharge is used to shape a channel of ionized material in the target. Then, electrical energy is applied to the target material, converting to plasma the target material within the ionization channel. Thus, the laser discharge determines and stabilizes the position, shape, and volume of the electrical discharge plasma. As a result of this technique, the same power plasma can be produced with a lower intensity laser input, or higher power plasma as achieved with the same laser source.

In another embodiment, an electrical energy source creates the plasma discharge that emits a radiation field (i.e. the plasma radiation source). When an electrical current is passed through a material between two electrodes, an arc discharge is formed. Plasma is formed in the target material by an electrical current at sufficient power levels. The plasma is shaped by the path of electrical discharge, and as in other embodiments, the shape of the plasma discharge determines the shape of the radiation source (i.e. field) at a wavelength $\lambda_2$. As in other embodiments, the use of different target materials will vary the radiation output, such as the wavelength ($\lambda_2$) of the emitted radiation.

In one embodiment, the shaped radiation field emitted from a plasma discharge on the target is efficiently collected in and conveyed through condenser optics and ultimately impinges upon a transmissive or reflective object (such as a photolithography mask) which is imaged (such as using a camera) onto a recording medium (such as a photoresist coated wafer), imprinting the desired pattern on the recording medium. This shaped radiation source provides sufficient light energy and coherence for mask illumination in a photolithography system. As discussed above, in photolithography, typical point-type radiation source has an undesirably high level of coherence, which can result in a reduced image quality at the wafer. One advantage of the present invention is that a lower level of coherence in the radiation source can be achieved by shaping the radiation source, permitting a higher resolution in the imaging of a mask onto a wafer in a photolithography system.

These and other features and advantages of the present invention will be appreciated from review of the following detailed description of the invention, along with the accompanying figures in which like reference numerals refer to like parts throughout.

DETAILED DESCRIPTION OF THE INVENTION

Figure 1A:
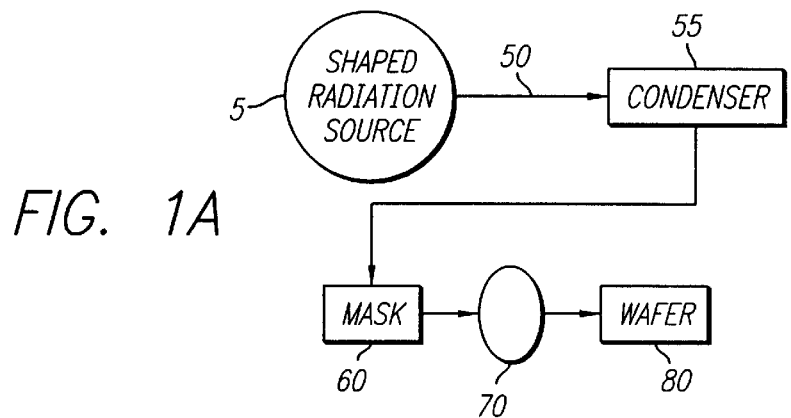
FIG. 1A is a diagrammatic illustration of a shaped plasma discharge system in accordance with the present invention.

In accordance with the present invention, a shaped plasma discharge system is provided. A shaped radiation source 5 emits radiation 50 at a desired frequency ($\lambda_2$) and in a desired shape, as illustrated in FIG. 1A. In a preferred embodiment, a plasma generating target is excited to emit the radiation 50 at the desired frequency ($\lambda_2$) and in the desired shape. The radiation 50 of the plasma discharge is preferably directed to provide the illumination in a photolithography system. Exemplary plasma discharge shapes are an arc, line, circle, ellipse or an array of small discs filling such shapes, or any combination of these shapes.

Figure 1B:
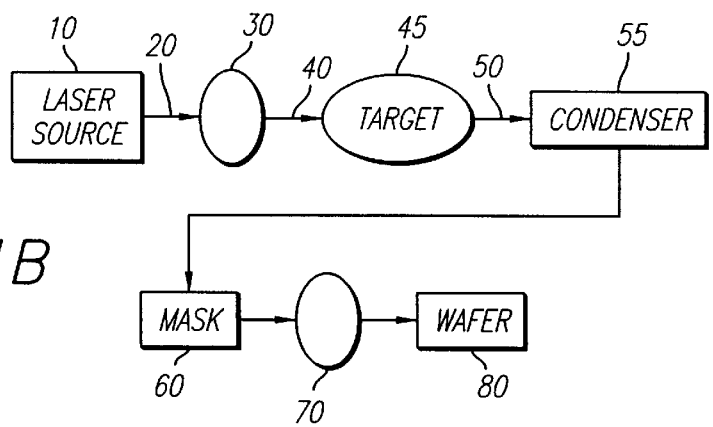
FIG. 1B is a diagrammatic illustration of an embodiment of a shaped plasma discharge system in accordance with the present invention using a laser source.

As illustrated in FIG. 1B, a laser source 10 is provided in a laser-based embodiment. Any suitable laser source 10 may be used that can provide light at a desired wavelength, power level and beam quality. Regarding the power level, it is preferred that the laser source 10 provides an output beam 20 with an intensity that is sufficient to generate a desired radiation emission from target 45, for example in an intensity in a range of $10^{11}$ and $10^{15}$ watts per square centimeter may be selected. The output beam 20 preferably is shaped using shaping optics 30 to provide a shaped output laser beam 40 to the target 45, the shaped output laser beam 40 having a cross-sectional illumination field profile. Any shaped illumination field 35 may be created using the shaping optics 30 as long as a shaped beam 40 having a sufficient intensity level is provided to the target 45. A shaped plasma source is created at target 45, which emits the shaped radiation field 50 having wavelength $\lambda_2$. Condenser 55 preferably collects as much of the radiation 50 as possible and directs it to a reflective or transmissive object 60 to be illuminated by radiation 50. Preferably object 60 is a mask. Condenser 55 optimally directs the radiation on the object 60 in a desired shape, such as illustrated in FIGS. 2–4 or 8, although any desired shape may be selected. The fact that radiation comes from a shaped radiation source optimizes the process so that condenser 55 relays the shape of the source onto the object 60.

The camera 70 uses the shaped radiation field ($\lambda_2$) to image the structure of the object 60 onto the recording medium 80. Preferably the recording medium 80 is a photoresist coated wafer, although any suitable recording medium may be used. The camera 70 is preferably constructed of a plural mirrors and/or lenses. For short wavelengths, such as extreme ultraviolet or x-ray radiation, the camera 70 preferably includes mirrors and the shape of the radiation illumination field (at a wavelength $\lambda_2$) selected is preferably an arc type of shape since that shape tends to be easier to image with currently widely known camera mirrors, although it is understood any shape may be selected. The radiation field preferably is scanned across the object 60. Alternatively, the object 60 can be moved, or a combination of movement of object 60 and scanning of the radiation field to completely illuminate the object 60 with the radiation and to completely image it on the wafer 80. The wafer 80 may also be moved during illumination to fully project the object 60 on the wafer 80. Preferably the camera 70 is a reduction camera. In a photolithography process, the wafer 80 is preferably covered with a photosensitive material onto which the reduced image of the mask 60 is exposed. After exposure, the photoresist is "developed" so that the image of the mask creates the desired microcircuits on the wafer 80, which preferably is a silicon based wafer.

Thus, in an exemplary (but not limiting) embodiment, the shaped radiation field 50 illuminating the mask 60 is imaged by the camera 70 onto the wafer 80. The shaped radiation field in this example is maintained in a given position at the mask 60, and its image through the camera 70 is also maintained at a given position. Both the mask 60 and the wafer 80 are simultaneously moved relative to the shaped radiation field. The movements of the mask 60 and the wafer 80 are preferably set to obtain a complete image of the mask 60 on the wafer 80.

Using a pulsed output beam 20, it is possible to operate at a relatively low energy level while achieving a desired level of intensity at the target 45, for a short duration, as demonstrated by the known equation for laser intensity:

$$\text{Intensity} = \frac{\text{Energy/pulse}}{A * T/\text{pulse}}$$

The intensity is equal to the energy in each laser pulse (Energy/pulse), divided by the illumination area (A) and the pulse duration (T/pulse).

A preferred laser source 10 is a short pulse laser, as described in commonly assigned, co-pending U.S. patent application Ser. No. 09/058,274, now U.S. Pat No. 6,016,324 entitled "Short Pulse Laser System" and U.S. Pat. No. 5,742,634, entitled "Picosecond Laser", both of which are referred to and incorporated herein by reference. However, it should be understood that these particular laser sources are mentioned as examples and any laser source generating a beam 20 providing sufficient intensity at the target 45 can be used. In an exemplary embodiment, a beam intensity of between $10^{11}$ and $10^{12}$ watts per square centimeter ($cm.^2$) at the target 45 is preferred to generate a sufficiently hot plasma for exciting target emissions in the x-ray, soft x-ray, extreme UV and deep UV spectral regions. However, it should be understood that any beam intensity suitable for generating a laser plasma at the target 45 that is suitable in imaging systems (i.e. lithography systems used in imprinting photoresist coated wafers, such as in integrated circuit manufacture) can be used, for example in a range of $10^{11}$ and $10^{15}$ watts per square centimeter at the target 45 or any other suitable intensity. As an example, laser source 10, as described above, can provide output beam 20 having 500 to 1000 pulses per second of, for example 100 or 800 picosecond duration, and 100 to 500 milliJoules/pulse. Another example has a laser source providing an output beam 20 having between 1 and 100,000 milliJoules/pulse. Exemplary wavelengths are in the range of 0.2 micron to 1 micron, although it should be understood that any wavelength for the output beam 20 may be used that can generate the desired intensity level and excite the target material to produce the desired radiation wavelength ($\lambda_2$). In one embodiment, if an illumination area of approximately 0.005 $cm.^2$ on the target 45 is desired an intensity within the desired range can be achieved.

Any shape illumination field may be created using the shaping optics 30 as long as a shaped beam 40 having a sufficient intensity level is provided to the target 45.

Figure 2:
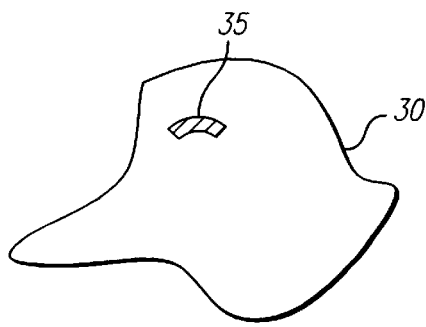
FIGS. 2–4 illustrate exemplary illumination fields ($\lambda_1$) and shaped radiation sources ($\lambda_2$) in accordance with the present invention.
Figure 3:
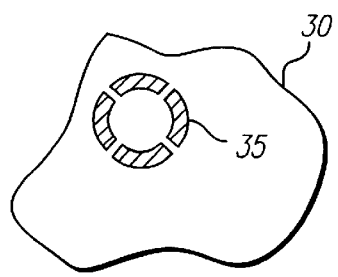
Figure 4:
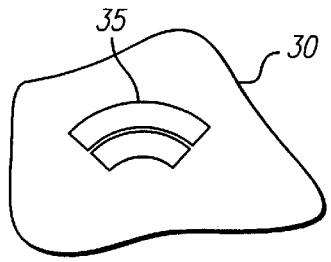

It should be appreciated that although this discussion has been directed to the shape of the illumination field created in the embodiment where a shaped laser beam is provided, this discussion equally applies to other embodiments of the invention in which the plasma discharge is shaped. Thus, the shapes illustrated in FIGS. 2–4 and 8 illustrate both desired shapes for an illumination field in a shaped laser source embodiment, as well as desired plasma radiation field shapes, both in embodiments where some shaping is imparted by the laser source as well as embodiments discussed in greater detail below in which the plasma discharge is shaped. In a preferred embodiment, an arc shaped illumination field (or plasma radiation field) 35 is provided, as illustrated in FIG. 2. In an alternative embodiment, a ring shaped illumination field (or plasma discharge) 35 is provided, as illustrated in FIG. 3. As illustrated in FIG. 3, the illumination field (or plasma discharge) 35 includes plural segments making up the ring. For example, four arc shaped segments covering approximately 90° (or optionally less or more in each segment) each may be used to create an approximately 360° annular illumination field or a quadruple illumination field. In another example illustrated in FIG. 4, two stacked arcs are provided as the illumination field. It should readily be appreciated that FIGS. 2–4 also illustrate exemplary shaped radiation sources and radiation field shapes for use in accordance with the present invention.

Figure 5:
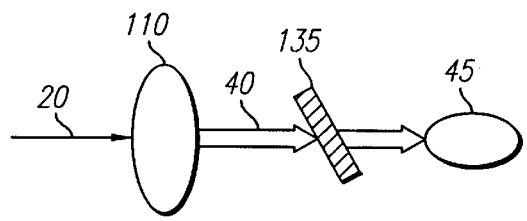
FIGS. 5–7 illustrate exemplary laser beam shaping optics in accordance with the present invention.
Figure 6:
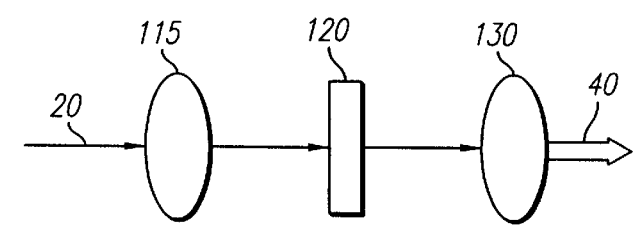
Figure 7:
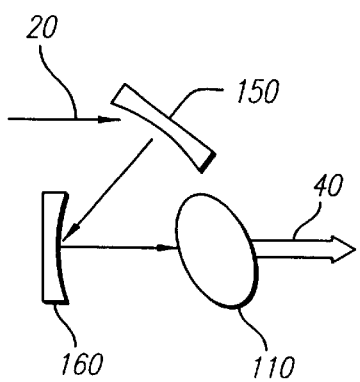

Continuing with the discussion of the shaped laser source embodiment, in another more preferred embodiment, the shaping optics 30 include a series of shaping apparatus, represented using reference numerals 115, 120, 130, which receive the output beam 20, flatten it to create a more uniform profile, and shape it to produce the shaped output beam 40, as illustrated in FIG. 6. In this embodiment, the uniformity of the beam is preferably first increased. Generally speaking, the output beam 20 may have a non-uniform distribution profile, such as a gaussian profile. A uniformizing lens 115, such as a gaussian to flat top lens, or alternatively a series of optics, are used to flatten the profile, such as to create a flat top profile. Preferably a stop lens 120 receives the beam and creates a desired shape to be received in the shaping lens or lenses 130. For example a pie-, or wedge-shaped profile may be imparted. The shaping lens 130 may include a single lens, or multiple components, such as plural lenses or mirrors, or combinations of lenses or mirrors. In one embodiment, an ogival aspheric lens 130 (or mirror) is used. An example using shaping mirrors is illustrated in FIG. 7. In that example, one or more shaping mirrors is used, such as mirrors incorporating a shaping curvature. As illustrated in FIG. 7, two shaping mirrors 150, 160 and a shaping lens 110 are used. In an alternative embodiment, the uniformity of the shaped output beam 40 is adjusted, such as by using a random phase plate 135. This example of uniformizing (i.e. flattening) the field is illustrated in FIG. 5, although it should be understood that flattening may be performed at any point in the optical processing upstream of the target 45. In an embodiment where it is desired to create an arc-shaped laser beam cross-section, both cylindrical and cubic aspheric optics are preferably used. In an embodiment where it is desired to create a generally line shaped laser beam cross-section, a cylindrical or cubic aspheric optic preferably is used. In an embodiment where it is desired to create a laser beam cross-section having an array of focused spots, it is preferred that an array of minilenses, a prism array or a grating be used.

Figure 8:
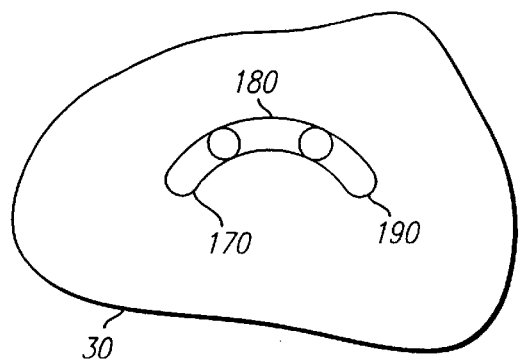
FIG. 8 illustrates an overlapping illumination field (and shaped radiation source) in accordance with the present invention.

It should be appreciated that the shaping components can be selected with varying properties to produce the desired shaped illumination field 35. Likewise, a compound, or holographic lens can be used for any of the shaping lenses 110, 135. Such a lens has a varying diffractive pattern within the lens, which can be used to shape the laser light into any desired pattern. Such a lens also is well suited to produce an illumination field 35 having plural components, such as the illumination field 35 illustrated in FIG. 3. A preferred holographic illumination field (or radiation source) is illustrated in FIG. 8 in which an arc is composed of three overlapping segments 170, 180, 190.

Figure 9:
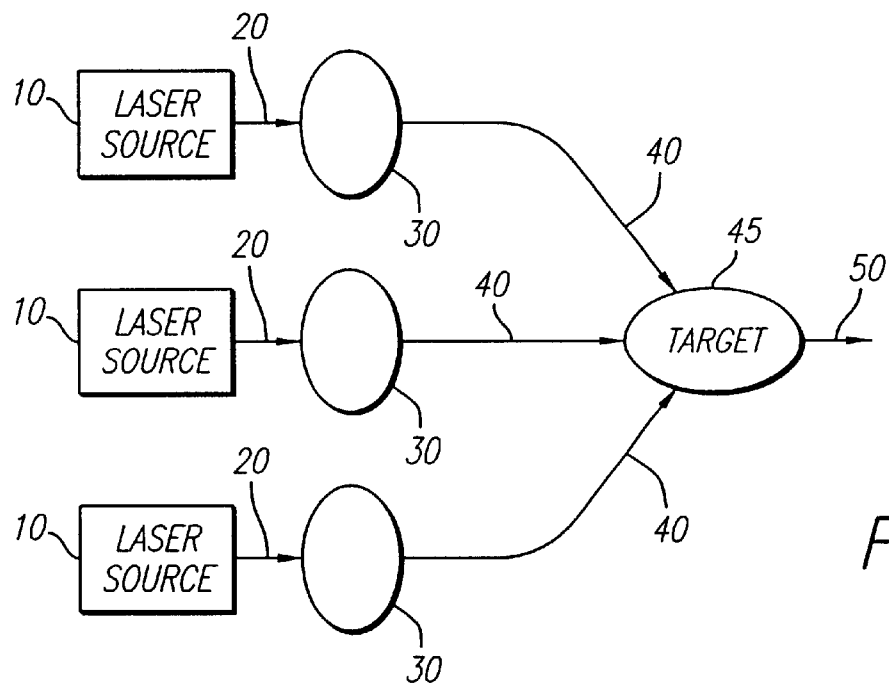
FIGS. 9–14 are diagrammatic illustrations of exemplary laser source and shaping optics configurations in accordance with the present invention.

A multi-segment illumination field (and hence a multi-segment plasma radiation source) also can be used by providing more than one laser output beam 20. By way of example, any number of laser sources 10 can be used, each producing an output beam 20. This example is illustrated in FIG. 9. In the illustrated example, three laser sources 10 are provided, each producing an output beam 20. Each output beam 20 goes to shaping optics 30. Any form of shaping optics 30 can be used that can produce the desired illumination field. In the illustrated embodiment, separate shaping optics 30 are provided for each output beam. The respective shaped output beams 40 then proceed to the target 45. They may either go directly from the shaping optics 30 to the target 45, or may be directed by directing optics to the target 45.

Figure 10:
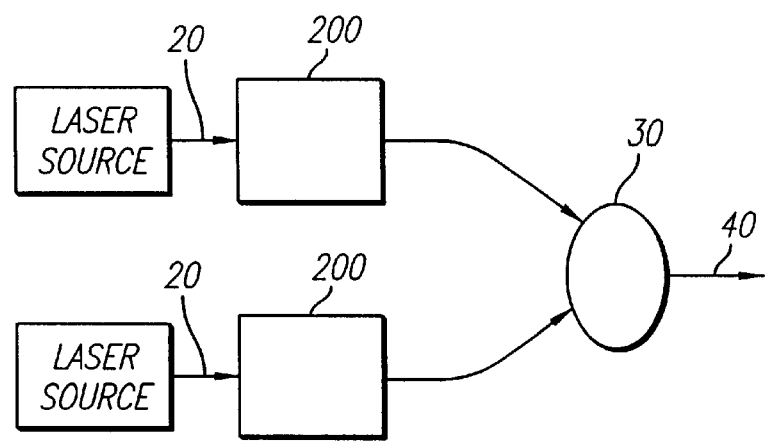

It should be understood that the output beams may also be directed to a single shaping optics system 30, as illustrated in FIG. 10. Directing optics 200 receive the respective output beams 20 and direct them such as by the use of mirrors or directing lenses to a desired transmission vector. Alternatively one or more of the laser sources 10 directs their respective output beam 20 directly to the shaping optics 30.

Figure 11:
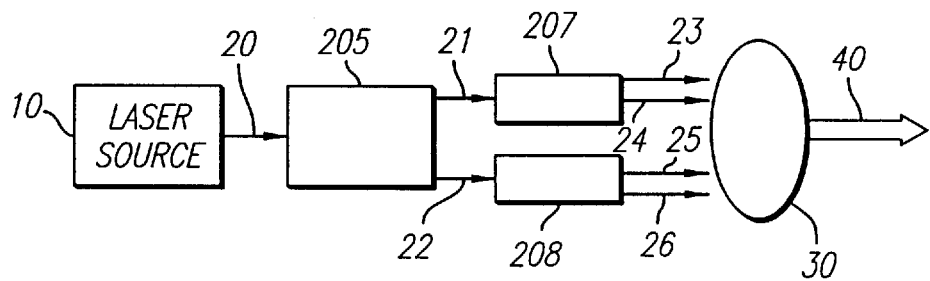

In an alternate embodiment, as illustrated in FIG. 11, a single laser source 10 is used and the output beam 20 is split into plural output beams. A splitter 205 can split the beam in any number of ways. Likewise, plural splitters may be used. In the illustrated example, a first splitter splits the output beam 20 into two beams 21, 22. Second and third splitters 207, 208 in turn split each of beams 21 and 22 into two beams. Beams 23 and 24 exit splitter 207 and beams 25 and 26 exit splitter 208. These beams 23 through 26 are received in shaping optics 30, generating a shaped laser beam field 40. Further directing optics (not shown) also may be provided to direct segments of the output beam as desired. These output of splitters 205, 207, 208 split beams 21, 22, 23, 24, 25 and 26 are referred to as split beams or secondary output beams for discussion purposes.

Figure 12:
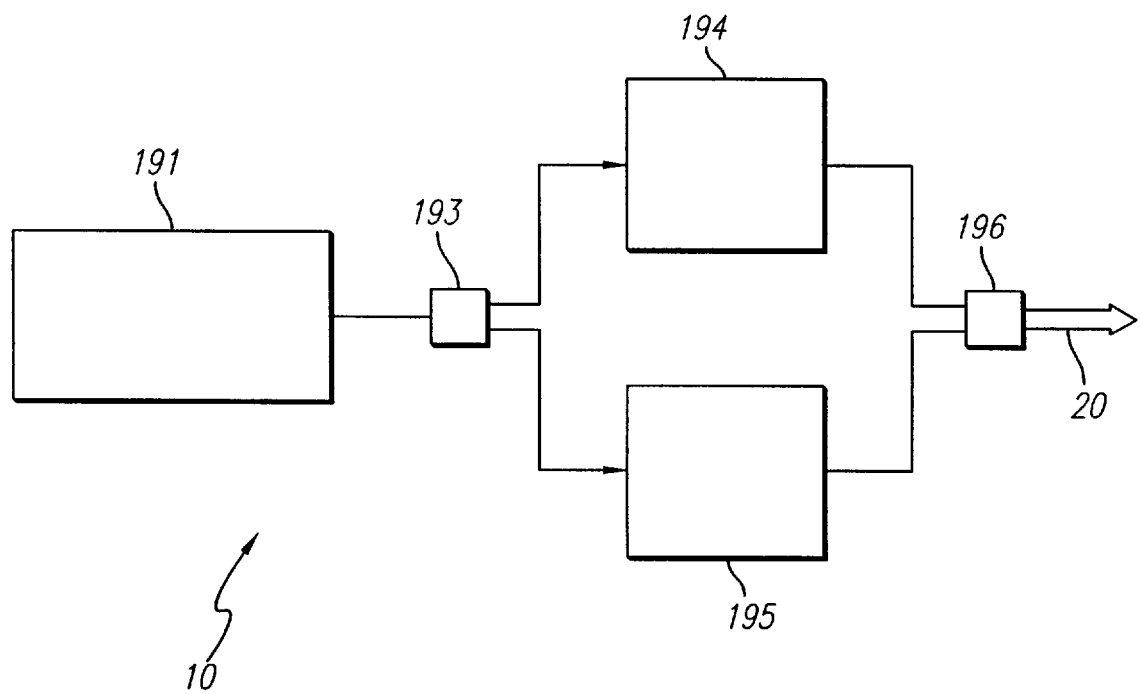

The laser source 10 may include various configurations. One example is shown in FIG. 12. A master oscillator and power amplifier 191 provides, for example, a series of laser pulses with, for example, a 700 picosecond or a 400 picosecond pulse duration with a 20 millijoules pulse energy. The laser beam is split using a splitter 193 and the two split beams go from the splitter to respective amplifiers 194 and 195. The amplifiers boost the pulse energy to 250 millijoules, although any suitable energy level may be selected. The amplified beams are combined, such as using a dichroic mirror 196 to produce a single pulse output beam 20 having a pulse energy of 500 millijoules. A single amplifier, or other combinations of amplifiers also may be used.

Figure 13:
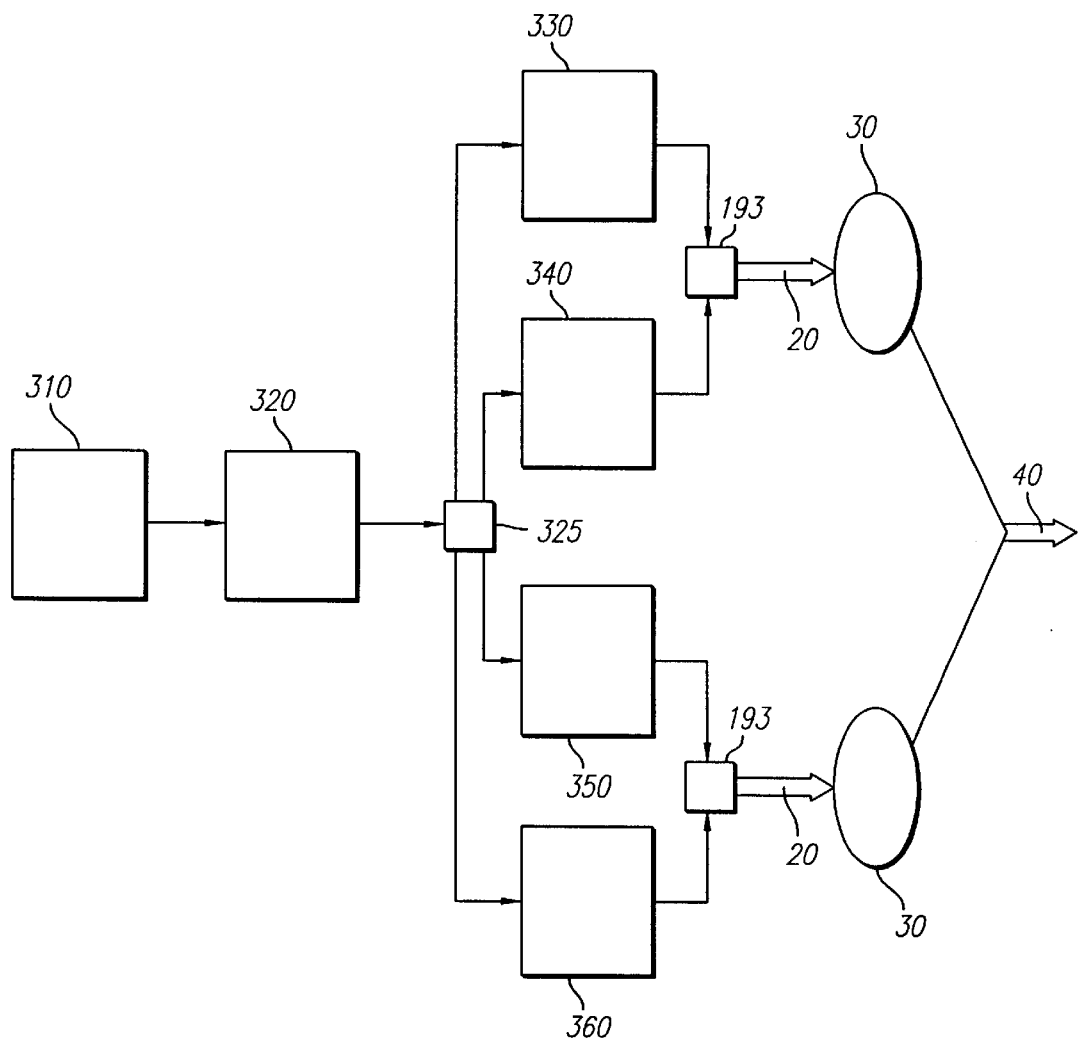

Another example of the laser source is illustrated in FIG. 13. In that example, the laser source 10 provides two output beams 20, each of which is separately processed into a shaped output beam 40. It should be appreciated that in this embodiment, any number of output beams 20 may be created, resulting in a like number of shaped output beams 40. In the illustrated configuration, a master laser oscillator 310 provides a beam of pulses of 1 millijoule energy, for example to the power amplifier 320, which raises the power level to 120 millijoules, the resulting output is split four ways, such as by using a single splitter 325, or any suitable combination of splitting components. The split beams are further amplified, such as to 250 millijoules or any other suitable power level, in each of amplifiers 330, 340, 350, 360. The outputs of amplifiers 330 and 340 are combined into a single output beam 20, such as a beam having 500 millijoules laser pulses. Likewise, the outputs of amplifiers 330 and 340 are combined into a single output beam 20, such as a beam having 500 millijoules laser pulses. Optionally the two output beams 20 proceed to separate shaping optics 30, or alternatively are processed by a shaping optics system, either way, creating shaped output beam 40. The illumination field 35 of the shaped output beam 40 may have any desired pattern to excite any desired plasma radiation from target 45.

Figure 14:
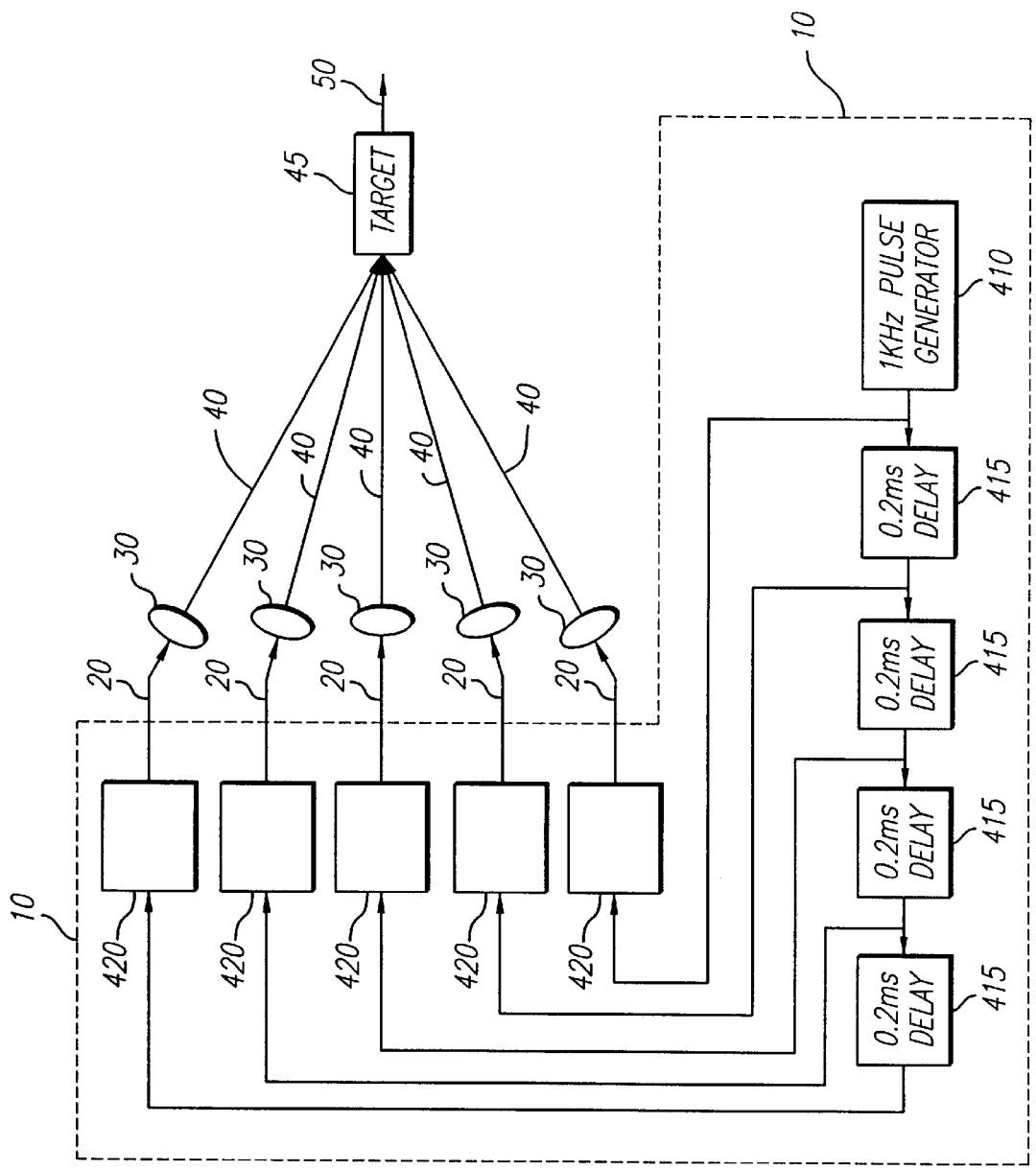

An alternative embodiment of the system is provided in FIG. 14. In that embodiment a pulse generator 410 provides, for example, timing pulses at a 1 kHz. repetition rate. Delays 415 are used to create a pulse train to plural laser generators 420. In the illustrated example, each of the delays 415 is a 0.2 millisecond delay and the laser generators 420 each operate at a 1 kHz. repetition rate, although it should be understood that any repetition rate can be selected that is consistent with the delays 415 and pulse generator 410. The respective output beams 20 of the laser generators 410 are shaped in shaping optics 30. Alternatively, a single shaping optics system can be used. The shaped output beams 40 then illuminate the target 45.

The multi-segment illumination fields may be in any desired shape or pattern. In one example, plural arcs are created, which are combined to form the ring field pattern in FIG. 3 or dual arc pattern in FIG. 4. Any of the above described examples, illustrated in FIGS. 9–14 may be used to produce such a segmented pattern. By way of illustration, the embodiment illustrated in FIG. 11 can be used, wherein each of the split beams 23 through 26 are used to generate a single arc field pattern (such as illustrated in FIG. 2). In combination, they can form the ring field pattern illustrated in FIG. 3. In another example, the embodiment illustrated in FIG. 13 is used to create the illumination field 35 illustrated in FIG. 4. Likewise, the output of amplifier 320, shown in FIG.13, may be further split to create more complex geometries, or the outputs of any of amplifiers 330, 340, 350 or 360 can be further split and amplified to create more complex geometries.

The shaped laser beam 40 (as depicted in FIG. 1B) hits the target 45 producing radiation 50 in the wavelength ($\lambda_2$) desired for imprinting the wafer 80 (and preferably in the desired shape, as described herein). The target 45 is selected for efficient conversion of the shaped output laser beam 40 (of wavelength $\lambda_1$) to an output radiation field 50 at the appropriate wavelength ($\lambda_2$) and being shaped in a shape corresponding to the shape of the illumination field 35. For example, if an arc-shape illumination field 35 is provided, the radiation field 50 (from the plasma source 45) is also arc shaped. Any size of target may be used, such as a stream of liquid (discussed in greater detail below), a gas, or a solid target (also discussed in greater detail below) which can be stationary or moving. The target 45 is also selected to generate minimal debris, which may degrade any of the components, such as mirrors or lenses in the system. It is also preferred that the target generate radiation 50 at a wavelength ($\lambda_2$) that is well reflected by mirrors which may need to reflect it, such as an optional condenser 55 or camera 70. The target material also preferably produces peak radiation at the desired wavelength. The target material may be selected from solids, liquids or gasses, although gases generally are less preferred because of their lower densities. Examples of solid target materials include solid metals, solid xenon and ice.

Figure 15:
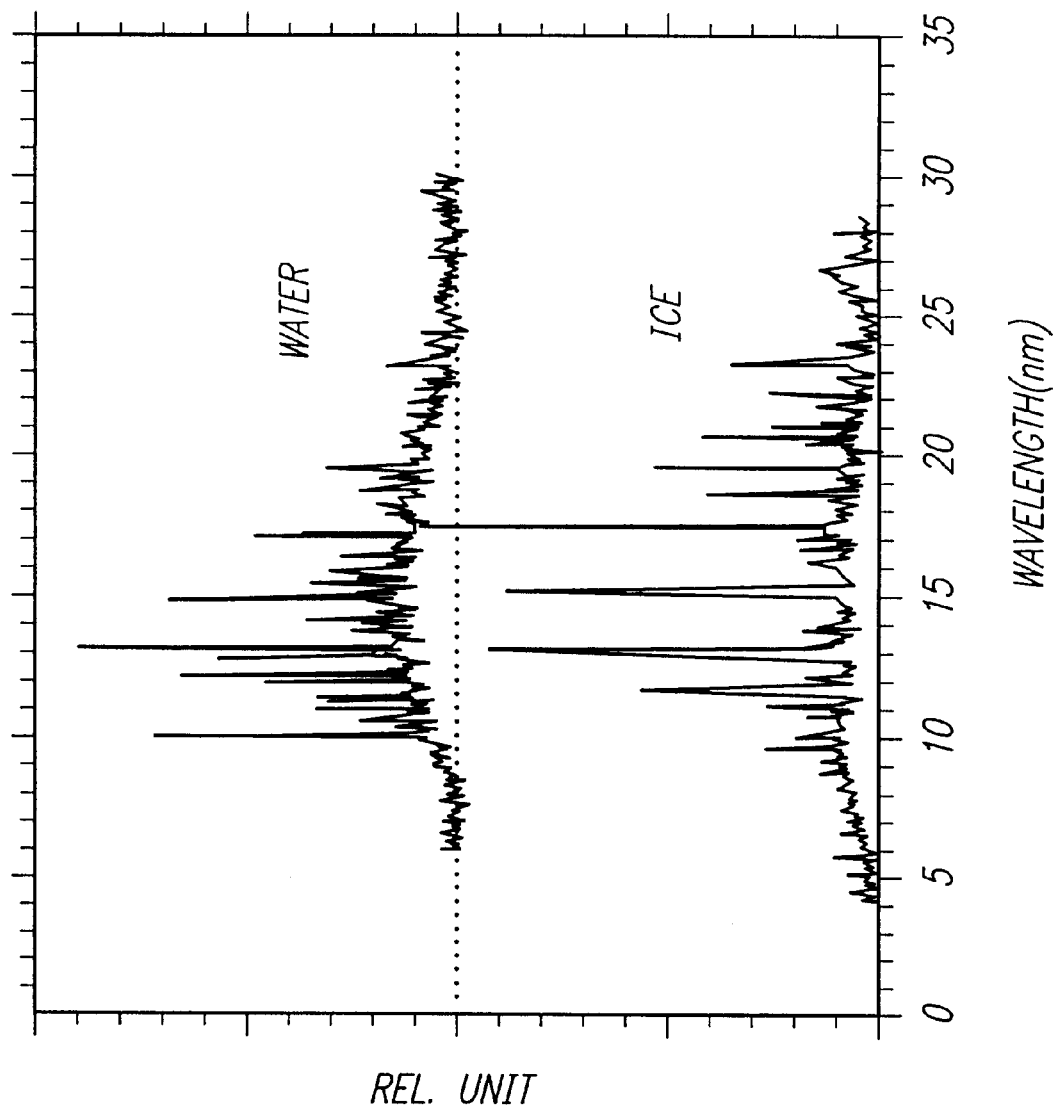
FIG. 15 is a graph showing the wavelength emission spectra of ice and liquid water in accordance with the present invention.

Ice is considered a good extreme ultraviolet target material because its emission spectrum peaks at wavelengths that may be desired in the extreme ultraviolet spectrum. An ice emission spectrum is illustrated in FIG. 15. As seen there, ice produces emission peaks at approximately 11.4 nm., 13 nm., and 15 nm. and 17.2 nm. which are at, or close to wavelengths that have been useful in producing integrated circuits, namely 11.4 nm. and 13.5 nm. These are desired wavelengths because high reflectively multilayer mirrors, such as Mo/Si mirrors, typically have maximum reflectivity at approximately 13.5 nm. and Be/Si mirrors have maximum reflectivity at approximately 11.4 nm. One or more of such mirrors can be used as components of a condenser 55 and/or the projection camera 70, as is well known in the art. In one embodiment the emission wavelengths of the ice target are shifted by controlling the temperature of the plasma produced.

Figure 16:
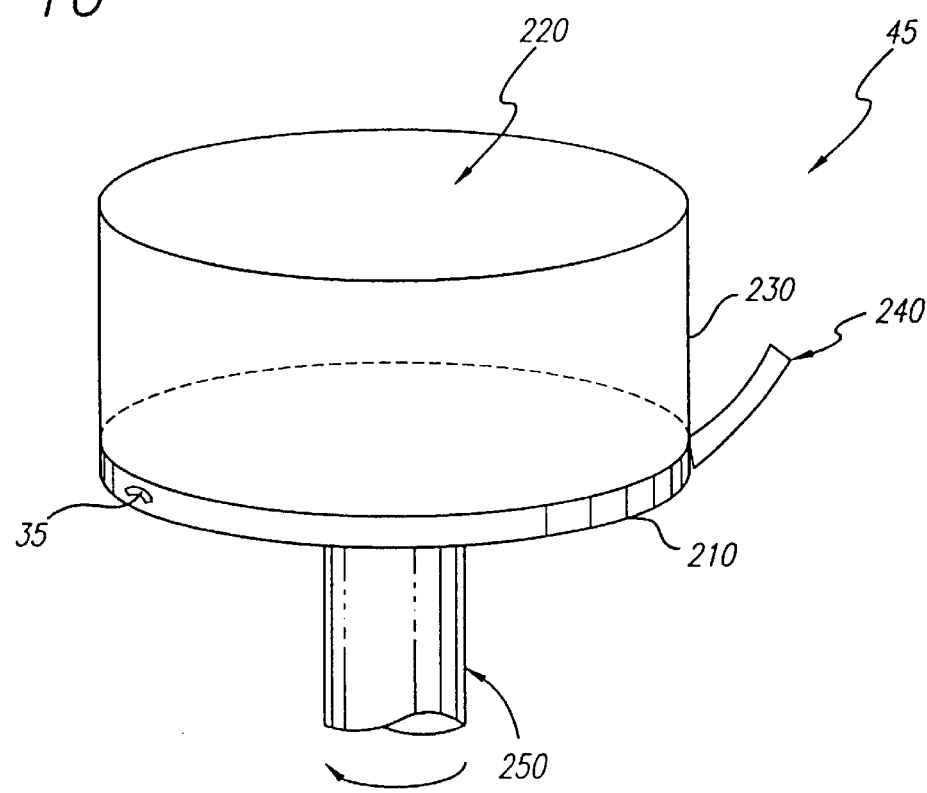
FIG. 16 illustrates a target in accordance with the present invention.

An exemplary target 45 using ice as the target material is illustrated in FIG. 16. The target 45 includes a block of ice 210, preferably in the form of a very thin sheet, which has an advantage of minimizing debris formation. However, any shape or thickness of ice 210 may be used. The ice preferably is cooled, such as by using a heat pump or liquefied gas, such as liquefied nitrogen. Cooling the ice serves to inhibit heat degradation and to minimize contamination of other components of the system by reducing the vapor pressure, thereby reducing debris. In one embodiment, a cooling material 220 is located in close proximity to the ice 210. By way of example, the cooling material 220 can be shaped like the ice 210 and superimposed upon it, such as in a stacked relationship, as illustrated. In a preferred embodiment, the cooling material 220 is a liquefied gas, such as liquid nitrogen. The liquid cooling material 220 is received in reservoir 230 which is in proximity to (or touching) the ice 210. The ice target 210 is preferably rotated in use so that the illumination field 35 progressively. strikes different portions of the ice target 210, avoiding excessive degradation of the ice target 210 at any particular location. An optional restoration unit 240 is provided to restore the ice, such as by shaving and/or re-freezing. Rotation shaft 250 provides the rotational force from a motor (not shown) so as to rotate the ice target 210.

Figure 17:
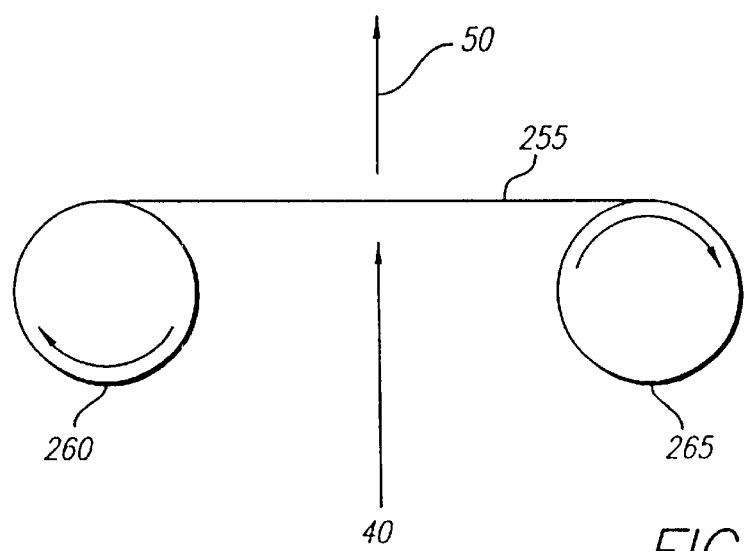
FIG. 17 illustrates another target in accordance with the present invention.

Other examples of suitable solid target materials are copper and tin. In an alternate embodiment, metallic strip 255, such as a strip, band or foil is used as the target material. In the embodiment illustrated in FIG. 17, the metallic strip 255 is in the form of a rollable web that is provided on a spool 260. In operation a take-up spool 265 operates to translate the strip 255 from spool 260, across the shaped output beam 40.

Figure 18:
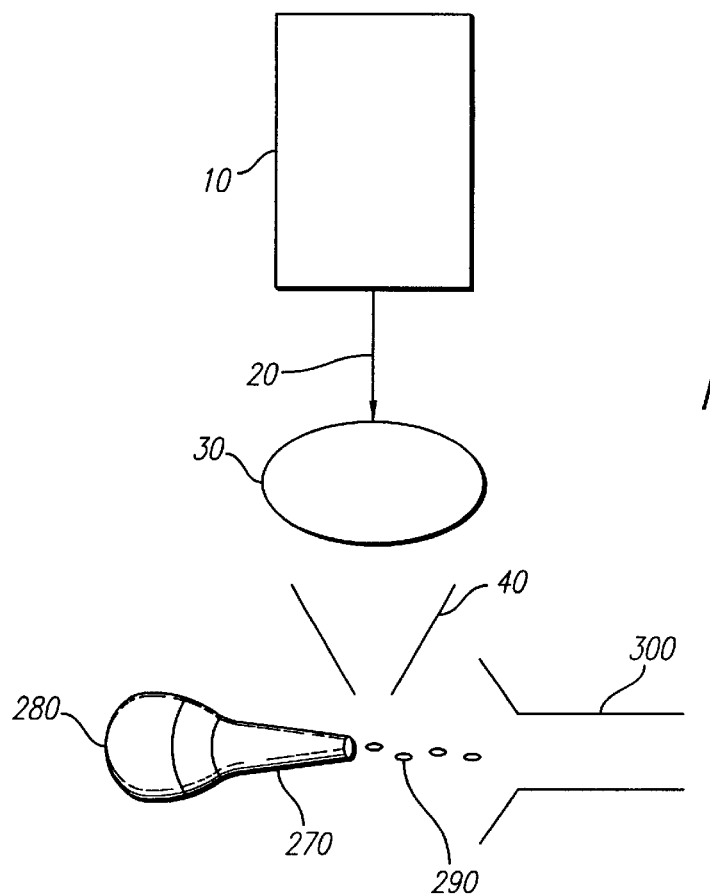
FIG. 18 illustrates an embodiment of a target system in accordance with the present invention.

In another embodiment, a liquid target is provided, as illustrated in FIG. 18. In this embodiment, a nozzle 270, connected to reservoir 280 emits a liquid clusters 290, for example xenon, in a stream. It should be understood that any nozzle 270 and reservoir source 280 arrangement can be used. For example, a supply line (not shown) may connect the source 280 with the nozzle, allowing for greater physical separation of the source 280 and the nozzle. Any reservoir 280 may be used, for example a gas canister (if a gaseous target is used) or a bin or hopper may be used. Any suitable nozzle 270 can be used. For example a jet-type nozzle may supply a jet or droplets.

One example of the nozzle, as illustrated, is a two-dimensional nozzle, providing a three-dimensional cluster (or micropellet) field as the target. The shaped laser light 40 hits the clusters causing radiation emission in the desired spectrum, such as the extreme UV spectrum. In one embodiment, the liquid is a liquefied gas, such as xenon, or other inert gas. In such an embodiment, a diffuser 300 optionally is provided to collect the gas that forms as the clusters 290 exit the nozzle 270, thereby reducing gas emission. The liquid target material may optionally be treated with additives to control the emission spectrum. By way of example, zinc chloride may be used as additives. Alternatively, instead of droplets, clusters or a jet 290 as the target, solid micropellets can be provided in a gas jet (for example, helium or krypton) such as via a suitable nozzle 270, and are positioned as illustrated with reference number 290. Examples of suitable materials for the micropellets are tin and copper.

A water emission spectrum is illustrated in FIG. 15 (above the ice emission spectrum discussed earlier). It is seen that the water emission spectrum includes emission peaks, for example, at approximately nm., 13 nm. and 14.5 nm. In one embodiment, the emission wavelengths of the water target are shifted by controlling the temperature of the plasma produced.

In another embodiment, electric energy is applied to the target material after the application of the shaped laser beam. First, the shaped laser beam forms an ionized channel of energized target material. Then, electrical energy is applied to further energize the target material. Because the electrical current will tend to travel through the path of ionized material created by the laser beam, the laser beam determines and stabilizes the position, shape, and volume of the plasma discharge. With the application of the electrical discharge, the same power radiation field 50 (of wavelength $\lambda_2$) can be produced with a lower intensity laser input, or higher power radiation field 50 can be achieved with the same laser source.

Figure 19:
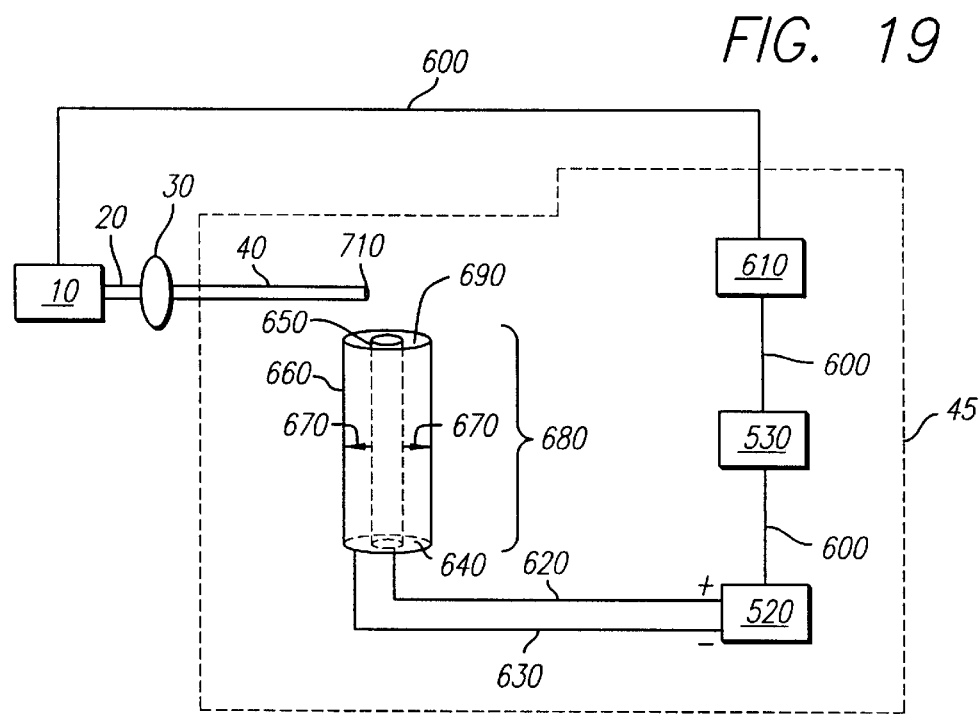
FIG. 19 illustrates an embodiment of a plasma radiation source in accordance with the present invention.

An alternative example in which the plasma radiation is shaped near the target is illustrated in FIG. 19. As in other embodiments, shaped optics 30 optionally may be provided to produce a shaped laser output beam 40. Alternatively, shaping optics 30 to shape the laser output beam 40 are not provided. The output beam 40 (either shaped or not shaped) creates an illumination field at a plasma generating target material 690. The laser output beam 40 energizes the target material 690 within the illumination field, and some of this material may form plasma. Additional energy also is provided, as described in greater detail below, to energize the target material 690 within the shaped illumination field, resulting in a more powerful radiation field 50 (of wavelength $\lambda_2$).

In the present embodiment, the additional energy is provided by an electrical discharge. The shaped laser output beam 40 creates a stable channel of ionized matter within target material 690. An electrical current will tend to flow through the ionized channel because abundance of free charge particles in this channel.

As illustrated in FIG. 19, laser source 10 is connected to a delay mechanism 610 and a switch 530 by a power line 600. Activation of the laser source 10 sends a signal through power line 600 directing to switch 530 to activate a power source 520. The delay mechanism 610 creates a pause that allows the laser output beam 40 to form an ionization channel prior to the electric discharge. The delay mechanism 610 is any sort of timer or device that delays the signal to switch 530 to create a pause between the application of the laser discharge 40 and the electrical discharge. For example, the delay mechanism 610 may be a computer programmed to idle for several processor cycles.

After the pause caused by the delay mechanism 610, a signal reaches the switch 530 to activate electric power source 520. The switch 530 may be any type of device to control the power source 520. In a preferred embodiment, a solid state electronic switch is used. Power source 520 may be any controllable source of electrical power sufficiently strong to produce the arc discharge. For example, power source 520 may be some type of battery or electrical generator. In a preferred embodiment, power source 520 is an electrical energy source combined with a capacitor bank to increase the peak power of the electrical energy source. The capacitor bank stores electricity from the electrical power source when the switch 530 is open (creating an open circuit) and dispenses electricity when the switch 530 is closed (creating a closed circuit).

Power source 520 is connected to two electrodes so that a current is passed through a target material located between the two electrodes. In a preferred embodiment illustrated in FIG. 19, the target material 690 is contained within plasma focus tube 680. Plasma focus tube 680 has a coaxial structure formed by an interior cylinder electrode 650, an exterior cylinder electrode 660, and a non-conductive base 640 which connects interior and exterior cylinder electrodes, respectively 650 and 660.

Power source 520 is connected by an outside power line 630 to exterior cylinder electrode 660. Power source 520 is also connected to interior cylinder electrode 650 by an inside power line 620. While FIG. 19 illustrates interior cylinder electrode 650 connected to the positive terminal of power source 520 and exterior cylinder electrode 660 connected to the negative terminal, this configuration could be reversed without effecting the device.

Once the external electric energy source 520 is activated by switch 530 after delay mechanism 610, electrical power is applied to the plasma focus tube 680, and a potential difference forms between internal cylinder electrode 650 and external electrode 660. As a result of this potential difference, a current 670 flows within the target material 690.

As previously discussed, the current 670 tends to flow through the ionization channel formed above the end of the inner electrode by the illumination field of the shaped laser output beam 40 ($\lambda_1$). Therefore, the shape of the plasma field may be highly regulated by the shape laser output beam 40. The target material 690 effected by the shaped illumination field will remain energized as long as shaped laser output beam 40 is applied. Therefore, the ionized channel created by the shaped laser output beam 40 is stable.

The target material 690 is preferably a gas at low pressure (about 1 torr), and the particular gas to be used depends on the radiation output desired. For example, the use of hydrogen would result UV radiation, while lithium vapor, xenon and helium would produce, respectively, EUV, EUV and X-Ray radiation. However, it should be appreciated that various target materials may be employed, as previously discussed in other embodiments.

It should also be appreciated that the electrical discharge may be applied prior to the laser pulse. In this embodiment, an electrical discharge is triggered, then a delay mechanism postpones the laser pulse. As a result of this sequencing, the electrical discharge first energizes the target material, then the shaped laser pulse 40 provides additional energy to form plasma within the illumination field. Thus the laser energy continues to regulate the shape and size of the plasma field.

Figure 20:
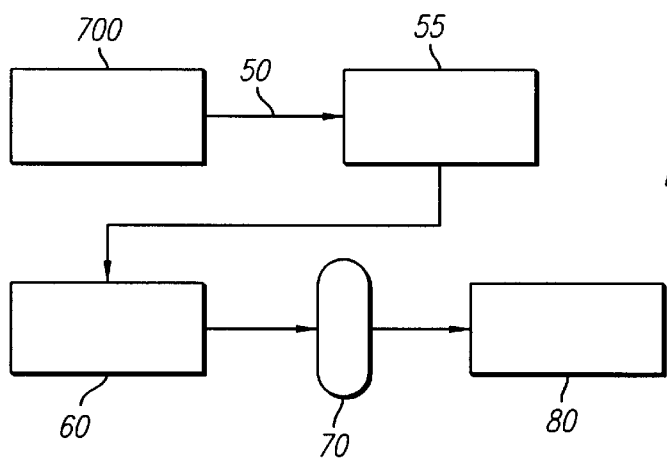
FIG. 20 is a diagrammatic illustration of an embodiment in accordance with the present invention.

FIG. 20 diagrammatically illustrates an alternative system to form radiation field 50 without a laser input. The target 45 is replaced by a shaped radiation device 700 (the shaped radiation device is also diagrammatically illustrated in FIG. 1A as shaped radiation source 5).

In a preferred embodiment, the shaped radiation device 700 has an electrical discharge that creates the shaped plasma discharge emitting radiation 50. When a continuous electrical current is passed through a target material between two electrodes, an arc discharge is formed by an electrical charge transfer along a narrow channel of high ion density. An electrical current with a sufficiently high power level will form plasma along the path of the current. Since plasma will only form along the path of the current, the arc discharge shapes the radiation field, such as discussed already regarding other embodiments of the invention. The electrical current can flow through a non-solid target material or along the surface of a solid target material. As in other embodiments of the invention, varying the target materials will vary the wavelength of the radiation output ($\lambda_2$)

Figure 21:
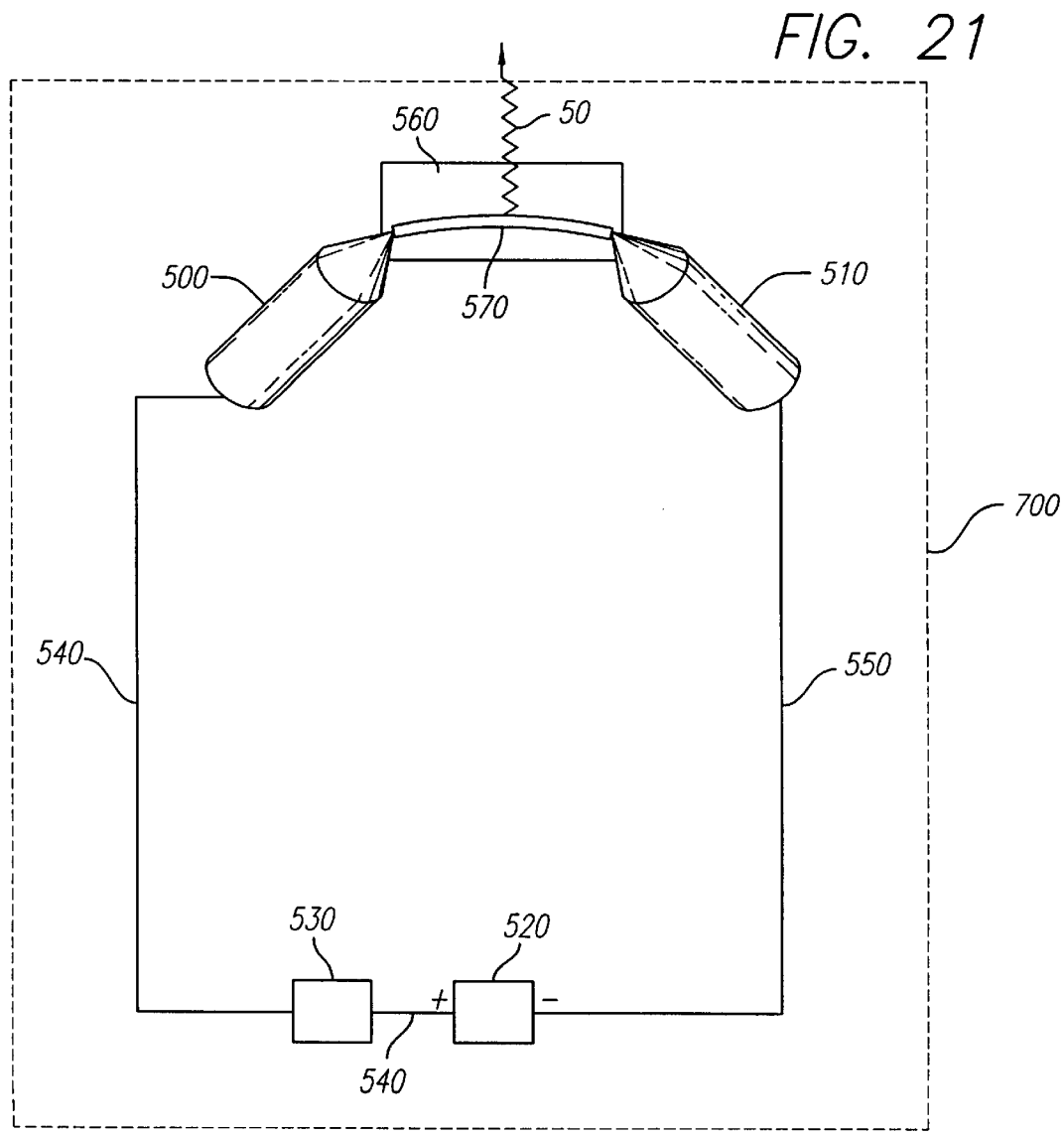
FIGS. 21 and 22 illustrate an embodiment in accordance with the present invention.

FIG. 21 illustrates an exemplary embodiment that uses electrical energy to form the plasma in the target material. Switch 530 activates power source 520 to initiate the electrical discharge. Power source 520 is connected to electrodes 500 and 510 by power lines 540 and 550. While FIG. 21 shows power line 540 connected to a positive terminal of power source 520 and power line 550 connected to a negative terminal, this configuration is merely to illustrate the application of electrical power by power source 520 and not a requirement of the embodiment. The illustrated configuration could be reversed to show power line 540 attached to the negative terminal of power source 520 and power line 550 attached to the positive terminal.

When switch 530 activates power source 520, a current flows between electrodes 500 and 510. Any type of electrodes may be used to form electrodes 500 and 510. Preferably, electrodes 500 and 510 are metallic pin electrodes that focus the electrical power into small points at the tips. These pin electrodes are widely commercially available.

The current flows through a target material 560 between electrodes 500 and 510 to form an arc discharge 570. The shape and width of arc discharge 570 is influenced by many factors including the spacing of electrodes 500 and 510, the amount of power provided by power source 520, and the type of target material 560. In one preferred embodiment, electrodes 500 and 510 are 5 mm apart, and the width of the arc discharge 570 is 100 to 400 $\mu$m.

Arc discharge 570 can occur within a nonsolid material or along the surface of a solid material. Target material 560 is selected to produce the desired radiation output, as previously discussed in other embodiments. In one embodiment plasma radiation is created by arc discharge 570 through Li vapor, Xe or He gas at 1 to 260 Torr. In another embodiment, the arc discharge 570 passes along the surface of a solid material such as tin or copper. It should be appreciated that other target materials may used to achieve the desired radiation output. The arc can be formed, for example, by a laser pre-pulse for use as an arc 35 between the electrodes, as discussed in the previous embodiment.

Figure 22:
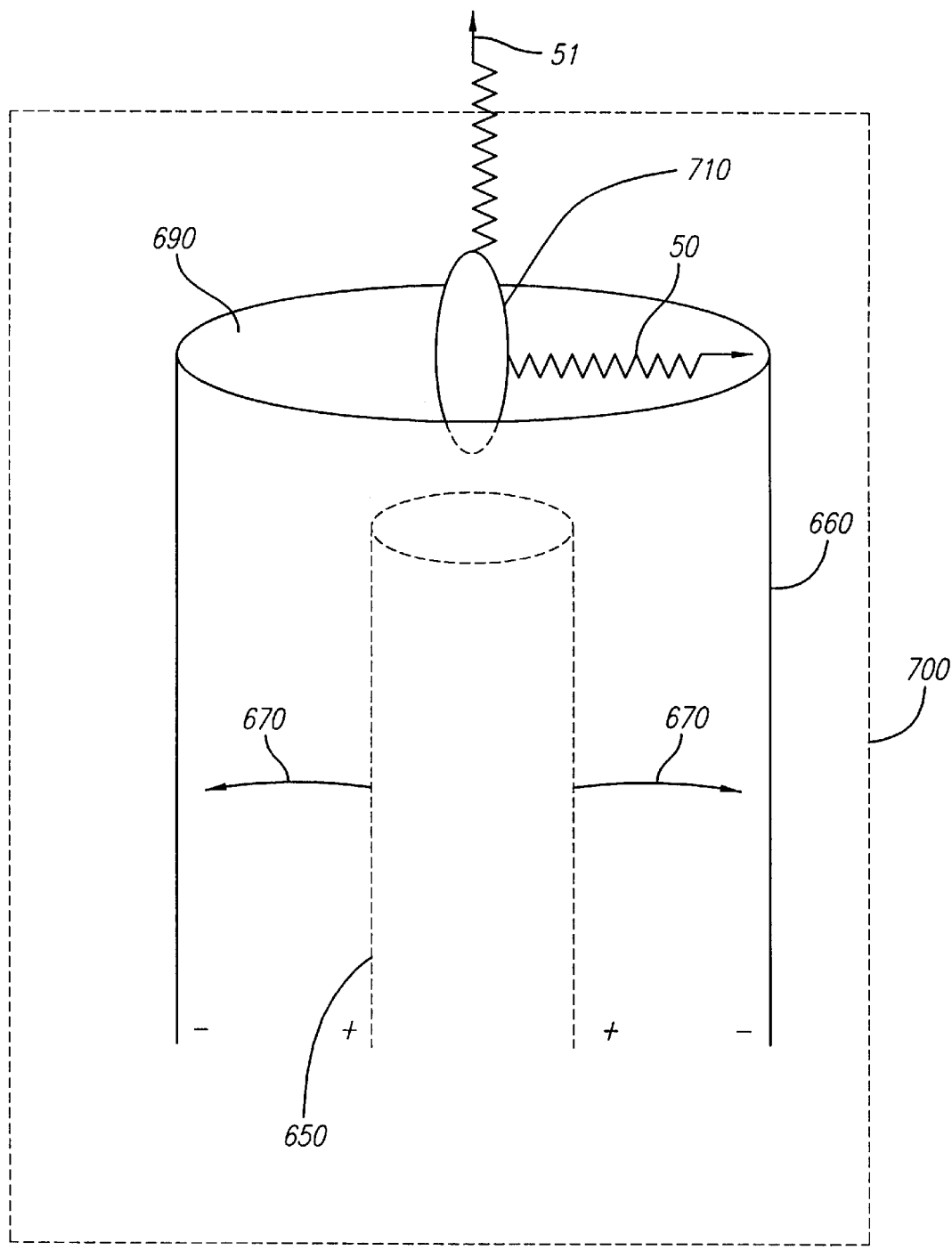

FIG. 22 illustrates preferred embodiment of a radiation device 700 and plasma focus 710 that functions without laser input. In this embodiment, shaped radiation device 700 has inner cylinder electrode 650 and outer cylinder electrode 660, and the target material 690 is positioned between the inner and outer cylinder electrodes, respectively 650 and 660. When electrical energy is applied to the radiation device 700, electric current 670 flows through the target material 690. The electrical current also generates a magnetic field, which in turn interacts with the electrical current to produce a force that serves to push the current sheet and ionized gas towards the open end of the coaxial electrodes. Eventually this ionized gas collapses into a very hot plasma formed in front of the inner electrode, forming the plasma focus 710. It can be appreciated from the previous discussions that various target materials 690 may be employed to achieve desired radiation outputs.

FIG. 22 illustrates the inner cylinder electrode 650 with a positive charge and the outer cylinder electrode 660 with a negative charge. This configuration leads to the electric current 670 flowing from the inner cylinder electrode 650 to the outer cylinder electrode 660. Alternatively, the relative charges can be reversed so that the electrical current 670 will flow through target materials 690 from the outer cylinder electrode 660 to the inner cylinder electrode 650. This change will not effect the creation a plasma discharge or the resulting shaped radiation output 50.

With sufficient power, electric current 670 generates a plasma focus 710. This plasma focus 710 forms in a straight line or has an elliptical or football shape. The shape of the plasma field is influenced by several factors, including the shape and size of inner and outer cylinder electrodes 650 and 660, the attributes of the target materials and the power of the electrical discharge. When viewed from the tip or short end, the plasma focus 710 forms a point focus that emits point radiation 51. Alternately, the plasma focus 710 forms a line or arc focus when viewed from the long side. The shaped radiation output 50 is taken from discharge viewed from the long side.

The output radiation 50 of wavelength $\lambda_2$ proceeds to illuminate the wafer. Various intermediary components preferably are provided between the target material and the wafer 80, although it should be understood that any apparatus (sometimes characterized as a condenser and camera) may be used that provides the output radiation 50 to the wafer 80 in a way that the wafer 80 (coated with photoresist) is imprinted with a pattern provided by a mask 60. As illustrated in FIGS. 1A, 1B and 20, a condenser 55 collects the output radiation 50. Any condenser optics or arrangement may be used that suitably directs the output radiation 50 to the mask 60 in the desired illumination pattern. Preferably the output radiation is shaped to be optimized for optical coupling with the condenser optics. Preferably, the condenser 55 is used to magnify the illumination pattern. In one embodiment, the condenser optics scan the output radiation to progressively illuminate the entire mask. Any form of mask may be used, such as a reflective or pass-through mask, as is known in the art. Optionally, imaging optics 70 may be provided between the mask 60 and the wafer 80, such as a photolithography camera arrangement.

Thus, it is seen that a system for directing emitted radiation to a wafer is provided. One skilled in the art will appreciate that the present invention can be practiced by other than the preferred embodiments which are presented in this description for purposes of illustration and not of limitation, and the present invention is limited only by the claims which follow. It is noted that equivalents for the particular embodiments discussed in this description may practice the invention as well.

What is claimed is:

1. An imaging system comprising:
   a plasma source providing a shaped radiation field, wherein said plasma source comprises a laser source providing an output laser beam, shaping optics converting the light from the light source into a shaped output laser beam, the shaped output laser beam having a cross-sectional illumination field profile, and a target generating a shaped plasma discharge emitting said shaped radiation field, the shape of the radiation field determined in part by the shape of the illumination field of said shaped output laser beam;
   a condenser having optics shaped to efficiently transmit the shaped radiation field;
   a transmissive or reflective object having a pattern thereon positioned to receive the shaped radiation field from the condenser;
   a recording medium illuminated by the shaped radiation field;
   at least one additional laser source, each providing an additional output laser beam; and
   at least one additional shaping optics corresponding to each said additional laser source, each said additional shaping optics converting the output laser beam from its corresponding additional laser source into a corresponding additional shaped output laser beam having a cross-sectional illumination field profile.

2. An imaging system comprising
   a plasma source providing a shaped radiation field, wherein said plasma source comprises a laser source providing an output laser beam, shaping optics converting the light from the light source into a shaped output laser beam, the shaped output laser beam having a cross-sectional illumination field profile, and a target generating a shaped plasma discharge emitting said shaped radiation field, the shape of the radiation field determined in part by the shape of the illumination field of said shaped output laser beam;
   a condenser having optics shaped to efficiently transmit the shaped radiation field;
   a transmissive or reflective object having a pattern thereon positioned to receive the shaped radiation field from the condenser; and
   a recording medium illuminated by the shaped radiation field;
   wherein the laser source includes:
      a pulse generator outputting a timing pulse to at least one delay element; and
      at least two laser generators, numbering one more than the number of delay elements, each laser generator generating an output laser beam.

3. An imaging system comprising:
   a plasma source providing a shaped radiation field, wherein said plasma source comprises a plasma generating target emitting said shaped radiation field, and a power source providing an electrical output to the target;
   a condenser having optics shaped to efficiently transmit the shaped radiation field;

a transmissive or reflective object having a pattern thereon positioned to receive the shaped radiation field from the condenser;

a recording medium illuminated by the shaped radiation field; and a delay mechanism, wherein said delay mechanism postpones the electrical output from said power source until after application of a laser beam.

4. A photolithography system comprising:

a power source providing an electrical output;

a plurality of electrodes connected to said power source to receive and direct the electrical output;

a target generating a shaped radiation field determined by current path of said electrical output, a condenser having optics shaped to efficiently receive the shaped radiation field;

a photolithography mask having a pattern thereon positioned to receive the shaped radiation field from the condenser;

a photoresist coated wafer illuminated by the shaped radiation field transmitted from the condenser.

* * * * *